(12) United States Patent
Ohba et al.

(10) Patent No.: US 8,426,249 B2
(45) Date of Patent: Apr. 23, 2013

(54) CHIP PART MANUFACTURING METHOD AND CHIP PARTS

(75) Inventors: Mitio Ohba, Osaka (JP); Nobuya Matsutani, Osaka (JP); Koji Shimoyama, Hyogo (JP); Yuichi Takahashi, Osaka (JP); Shinichi Morimoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 176 days.

(21) Appl. No.: 12/815,784

(22) Filed: Jun. 15, 2010

(65) Prior Publication Data

US 2010/0255638 A1 Oct. 7, 2010

Related U.S. Application Data

(62) Division of application No. 11/301,097, filed on Dec. 13, 2005, now abandoned.

(30) Foreign Application Priority Data

| Dec. 13, 2004 | (JP) | ................. | 2004-359411 |
| Dec. 13, 2004 | (JP) | ................. | 2004-359412 |
| Dec. 13, 2004 | (JP) | ................. | 2004-359413 |
| Dec. 13, 2004 | (JP) | ................. | 2004-359414 |

(51) Int. Cl.
*H01L 21/00* (2006.01)
(52) U.S. Cl.
USPC ........... 438/112; 438/113; 438/461; 438/462; 438/464
(58) Field of Classification Search ................... None
See application file for complete search history.

(56) References Cited

U.S. PATENT DOCUMENTS

| 4,803,453 A | 2/1989 | Tomono et al. |
| 4,933,209 A | 6/1990 | Anthony et al. |

(Continued)

FOREIGN PATENT DOCUMENTS

| JP | 57082179 A | 5/1982 |
| JP | 60-172337 U | 11/1985 |

(Continued)

OTHER PUBLICATIONS

Japanese Office Action issued in Japanese Patent Application No. JP 2004-359412 dated Mar. 9, 2010.

(Continued)

*Primary Examiner* — David E Graybill
(74) *Attorney, Agent, or Firm* — McDermott Will & Emery LLP

(57) ABSTRACT

The present invention provides a chip part manufacturing method comprising a separating process capable of suppressing deformation of chip parts, and also provides chip parts. It comprises a step of forming a plurality of frame-like void portions (32) in one main surface of substrate (30) and insulating resin layer (20) having a spiral void portion (40) disposed in the region thereof, a step of forming metal layer (36) in frame-like void portion (32) and spiral void portion (40) and on insulating resin layer (20), a step of polishing metal layer (36) at least up to the upper surface of insulating resin layer and forming coil section (18) in spiral void portion (40), and a step of forming a metal layer for connecting chip parts to frame-like void portion (32), wherein the metal layer is melted and removed by using an etching agent to separate a plurality of chip parts connected to each other by a frame-like connection.

2 Claims, 6 Drawing Sheets

U.S. PATENT DOCUMENTS

| | | | |
|---|---|---|---|
| 5,363,081 A | 11/1994 | Bando et al. | |
| 5,699,025 A | 12/1997 | Kanoh et al. | |
| 5,753,060 A | 5/1998 | Mori | |
| 5,880,662 A | 3/1999 | Person et al. | |
| 5,942,063 A | 8/1999 | Mori | |
| 6,004,705 A | 12/1999 | Masaki et al. | |
| 6,008,102 A | 12/1999 | Alford et al. | |
| 6,136,668 A * | 10/2000 | Tamaki et al. | 438/462 |
| 6,245,596 B1 * | 6/2001 | Kosaki et al. | 438/114 |
| 6,304,164 B1 | 10/2001 | Ohno et al. | |
| 6,335,265 B1 * | 1/2002 | Kosaki et al. | 438/462 |
| 6,459,351 B1 | 10/2002 | Maki et al. | |
| 6,515,568 B1 | 2/2003 | Maki et al. | |
| 6,603,190 B2 * | 8/2003 | Kosaki et al. | 257/618 |
| 6,715,197 B2 | 4/2004 | Okuyama et al. | |
| 6,771,476 B2 | 8/2004 | Fukuoka et al. | |
| 6,876,285 B2 | 4/2005 | Liang et al. | |
| 6,885,276 B2 | 4/2005 | Iha et al. | |
| 6,998,939 B2 | 2/2006 | Nakayama et al. | |
| 7,129,114 B2 * | 10/2006 | Akram | 438/110 |
| 7,291,444 B2 | 11/2007 | Yamashiki et al. | |
| 8,105,856 B2 * | 1/2012 | Noma et al. | 438/33 |
| 2001/0033219 A1 | 10/2001 | Iha et al. | |
| 2001/0054946 A1 | 12/2001 | Inoue et al. | |
| 2002/0008606 A1 | 1/2002 | Okuyama et al. | |
| 2002/0097547 A1 | 7/2002 | Fukuoka et al. | |
| 2003/0157783 A1 * | 8/2003 | Fonash et al. | 438/458 |
| 2003/0169575 A1 | 9/2003 | Ikuta et al. | |
| 2004/0259326 A1 * | 12/2004 | Hideo | 438/458 |
| 2005/0026393 A1 * | 2/2005 | Hirose et al. | 438/458 |
| 2006/0091534 A1 | 5/2006 | Ohba et al. | |
| 2007/0075819 A1 | 4/2007 | Okuzawa et al. | |
| 2010/0255638 A1 * | 10/2010 | Ohba et al. | 438/113 |

FOREIGN PATENT DOCUMENTS

| | | |
|---|---|---|
| JP | 01065803 A | 3/1989 |
| JP | 09260196 A | 10/1997 |
| JP | 10-256041 | 9/1998 |
| JP | 11-087115 | 3/1999 |
| JP | 11-186084 | 7/1999 |
| JP | 11-195533 | 7/1999 |
| JP | 11-243017 | 9/1999 |
| JP | 2000-269039 | 9/2000 |
| JP | 2001196258 A | 7/2001 |
| JP | 2001319840 A | 11/2001 |
| JP | 2002057036 A | 2/2002 |
| JP | 2004-014717 | 1/2004 |
| JP | 2005217053 A | 8/2005 |
| JP | 2005-277008 | 10/2005 |
| JP | 2006-173163 | 6/2006 |
| WO | WO 2004068516 A1 | 8/2004 |

OTHER PUBLICATIONS

Japanese Office Action issued in Japanese Patent Application No. JP 2004-359413 dated Mar. 9, 2010.

Japanese Office Action issued in Japanese Patent Application No. JP 2004-359414 dated Mar. 9, 2010.

Chinese Office Action issued in Chinese Patent Application No. CN 200510134262.8 dated May 20, 2011.

English translation of JP 11-243017, Murata MFG Co Ltd, Sep. 7, 1999.

* cited by examiner

CHIP PART MANUFACTURING METHOD AND CHIP PARTS

RELATED APPLICATIONS

This application is a Divisional of U.S. patent application Ser. No. 11/301,097, filed on Dec. 13, 2005 now abandoned, claiming priority of Japanese Patent Application Nos. JP 2004-359411, JP 2004-359412, JP 2004-359413, and JP 2004-359414, filed on Dec. 13, 2004, the entire contents of each of which are hereby incorporated by reference.

TECHNICAL FIELD

The present invention relates to a method of manufacturing chip parts used in various electronic apparatuses, and chip parts.

BACKGROUND ART

FIG. 6A to FIG. 6D are process diagrams showing a conventional chip part manufacturing process. FIG. 7 is an exploded perspective view of portion S of the chip part in FIG. 6B.

FIG. 6A is a sheet forming diagram, FIG. 6B is a coil section forming diagram, FIG. 6C is an element separating diagram, and FIG. 6D is an electrode forming diagram, which respectively show the manufacturing processes.

As shown in FIG. 6A, in the sheet forming process, a plurality of green sheets 1 are formed. Subsequently, as shown in FIG. 6B and in FIG. 7 mentioned later, in the coil forming process, arcuate conductors 2 are printed on the plurality of green sheets 1 by using Ag paste. Next, green sheets 1 are laminated to form coil section 3 formed from spiral conductor. In this case, arcuate conductors 2 printed on respective green sheets 1 are electrically connected to each other via through-hole 4 formed in green sheet 1, thereby forming coil section 3.

Next, as shown in FIG. 6C, in the element separating process, element 5 on green sheet 1 is cut off by cutter 6, using a dicing method or Thomson cutting method, and thereby, chip parts 7 are individually formed.

And, in the electrode forming process of FIG. 6D, chip part 7 is formed with electrode 7c. After that, the parts are burned to complete the manufacturing process.

As the document information of prior art related to the present invention, for example, Japanese Laid-open Patent H11-186084 is commonly known.

In the conventional configuration, in the element separating process shown in FIG. 6C, elements 5 adjacent each other are cut off by cutter 6, using a dicing method or Thomson cutting method, and therefore, it is necessary to provide additional cutting width for the blade thickness of cutter 6.

Also, the first corner formed at a surface perpendicular to the mounting surface is squared. In order to increase the number of chip parts per unit area of green sheet 1, if the cutting width of cutter 6 is reduced, the cutting stress caused by cutter 6 is liable to be applied to chip part 7, and there arises a problem of deformation of chip part 7.

Also, when a plurality of chip parts 7 are fed into the apparatus by means of a parts feeder or the like, causing the chip parts to come into contact with each other, the parts are not smoothly fed because the first corner of chip part 7 is squared, and there arises a problem of break or crack in chip parts.

DISCLOSURE OF THE INVENTION

The present invention provides a chip part manufacturing method including a separating process, which may solve the above problem and suppress deformation of chip parts, and a chip part.

Also, it provides chip parts capable of suppressing break or crack, for example, in feeding of chip parts.

The chip part manufacturing method of the present invention includes a step of separating a plurality of chip parts connected to each other by a connection. The connection is melted and removed by using an etching or release agent to separate the plurality of chip parts connected to each other by the connection.

In the above configuration, a plurality of chip parts are previously connected to each other by the connection formed from metal layer. The connection is melted and removed by using an etching agent to separate the plurality of chip parts connected to each other by the connection, and therefore, a problem of cutting stresses generated in chip parts can be prevented. As a result, it is possible to provide a chip parts manufacturing method capable of suppressing deformation of chip parts.

Also, in the chip part manufacturing method of the present invention, the connection is formed by a metal layer. Also, in the chip part manufacturing method of the present invention, the connection is formed by a resist or insulating resin layer.

In the above configuration, since the connection is melted and removed by using an etching or release agent for the purpose of separation, the problem of cutting stresses generated in chip parts can be prevented. As a result, it is possible to suppress the deformation of chip parts.

Also, the chip part manufacturing method of the present invention includes a step of forming an insulating resin layer having a plurality of frame-like void portions and a spiral void portion disposed within the region of the frame-like void portion, and a step of forming a metal layer on the frame-like void portion, spiral void portion, and insulating resin layer. It includes a step of forming a coil section formed by a spiral metal layer in the spiral void portion, polishing the metal layer at least up to the upper surface of the insulating resin layer.

Also, the chip part manufacturing method of the present invention comprises a step of forming a plurality of frame-like void portions at one main surface of a substrate, and a first metal layer forming step for forming a first metal layer in the frame-like void portion. Also, it comprises an etching step for etching a part of the first metal layer, and a step of forming an insulating resin layer having a spiral void portion in the region of frame-like void portion. Also, it comprises a second metal layer forming step for forming a second metal layer in the frame-like void portion and spiral void portion and on the insulating resin layer. Also, a step of forming a coil section formed by a spiral metal layer in the spiral void portion, polishing the second metal layer at least up to the upper surface of the insulating resin layer. Also, it comprises a step of forming a protective layer on the coil section, and a step of separating a plurality of chip parts connected to each other by a frame-like connection, removing the first metal layer and the second metal layer formed in the frame-like void portions by using an etching agent.

Also, a chip part of the present invention has a squared element and an electrode disposed at the end of the element, and is configured in that the first corner formed by surfaces vertical to the mounting surface which adjoin each other is generally arcuate, and that the second corner formed by surfaces vertical and parallel to the mounting surface which adjoin each other is generally squared.

Further, the chip part of another invention of the present invention has a squared element and an electrode disposed at the end of the element. The first corner formed perpendicularly of the mounting surface is generally arcuate. Also, the second corner formed adjacent to a surface parallel to the mounting surface is generally squared.

In the above configuration, the first corner formed by surfaces vertical to the mounting surface which adjoin each other can be formed generally arcuate. In this way, when feeding a plurality of chip parts into the apparatus by using a parts feeder or the like, the parts can be smoothly fed even in case the chip parts come into contact with each other, and it is possible to suppress the break or crack in chip parts. Particularly, since the second corner formed by surfaces vertical and parallel to the mounting surface which adjoin each other is generally squared, it is possible to suppress chip rising (Manhattan phenomenon) in mounting, that is, rising of chip parts from the mounting surface at one side, and due to the generally squared shape, the parts can be prevented from rising (getting up) or rotating.

In the above configuration, the first corner formed by surfaces vertical to the mounting surface which adjoin each other is generally arcuate, and therefore, when feeding a plurality of chip parts into the apparatus by using a parts feeder or the like, the parts can be smoothly fed even in case the chip parts come into contact with each other, and it is possible to suppress break or crack in chip parts. Particularly, since the second corner formed by surfaces vertical and parallel to the mounting surface which adjoin each other is generally squared, it is possible to suppress chip rising at the time of mounting.

DESCRIPTION OF THE REFERENCE NUMERALS AND SIGNS

Figure 1:
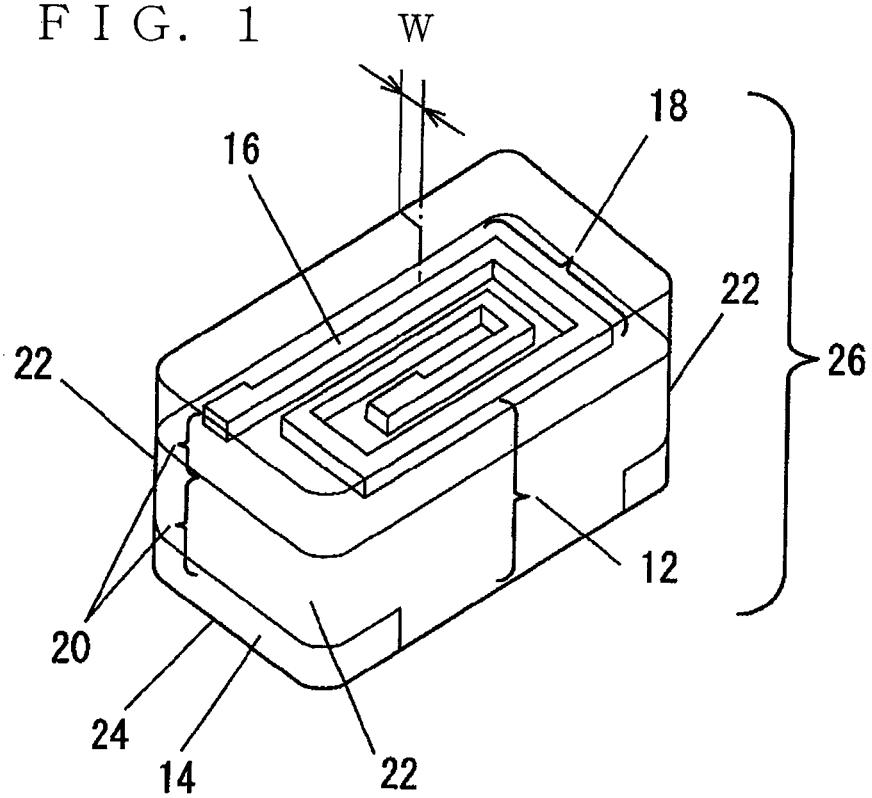
FIG. 1 is a perspective view of a chip part in one preferred embodiment of the present invention.

12 Element
14 Electrode
16 Spiral metal layer
18 Coil section
20 Insulating resin layer
22 First corner
24 Second corner
26 Chip part
28 Frame-like connection
30 Substrate
32 Frame-like void portion
34 Electrode void portion
36 Metal layer
38 Surface conductor layer
40 Spiral void portion
42 Through-hole void portion
44 Through-hole

DETAILED DESCRIPTION OF THE PREFERRED EMBODIMENTS (Preferred Embodiment 1)

Figure 2:
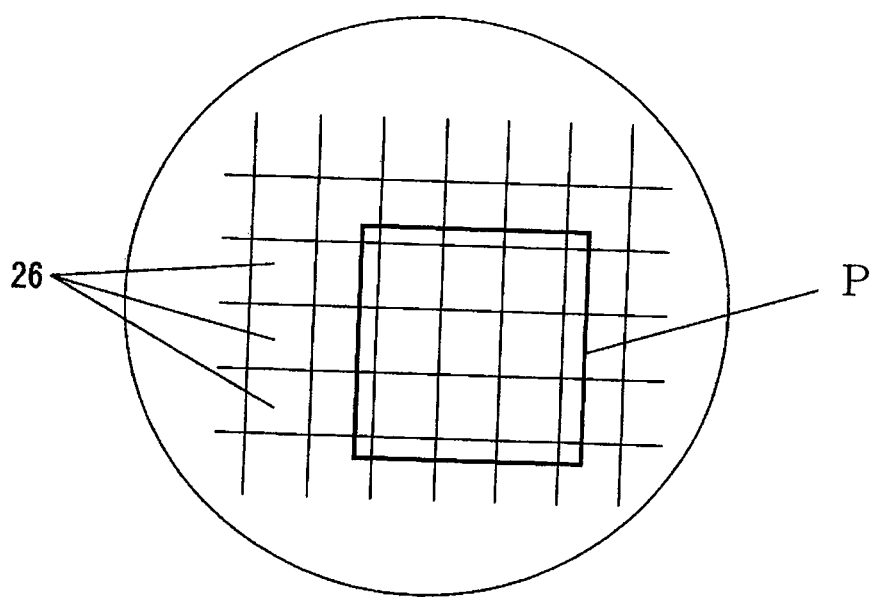
FIG. 2 is a schematic plan view showing a state of a plurality of chip parts connected in one preferred embodiment of the present invention.
Figure 3:
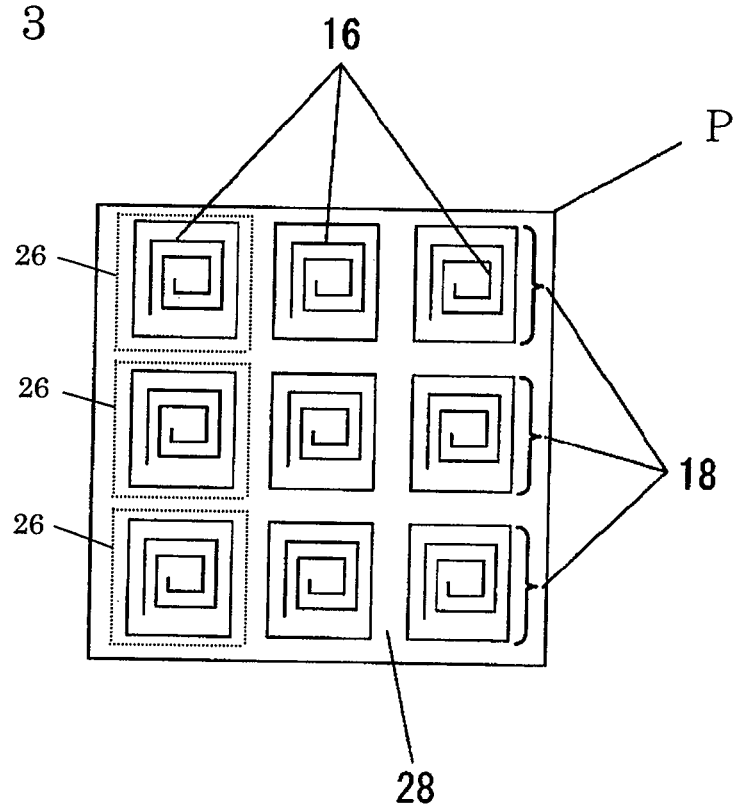
FIG. 3 is an enlarged plan view of portion P shown in FIG. 2 in one preferred embodiment of the present invention.

FIG. 1 is a perspective view of a chip part in the preferred embodiment 1. FIG. 2 is a plan view showing a state of a plurality of chip parts connected to each other. FIG. 3 is an enlarged view of portion P in FIG. 2. FIG. 4A to FIG. 4F are process diagrams showing a chip parts manufacturing process of the present invention.

In FIG. 1, chip part 26 in one preferred embodiment of the present invention is shown, for example, as a chip coil part. Chip part 26 comprises element 12 which is generally squared and transparent, electrode 14 disposed at the bottom of element 12, and coil section 18 formed by spiral metal layer 16 buried in element 12. Element 12 is formed by laminating insulating resin layers 20 formed from a photosensitive resin material obtained by hardening photosensitive resin.

Also, first corner 22 of chip part 26 is generally arcuate, which is formed at element 12, in a position perpendicular to the mounting surface. Second corner 24 is generally squared, which is disposed nearly parallel to the mounting surface of element 12. Also, second corner 24 is formed at electrode 14. In case the electrode 14 is disposed at the side of element 12, first corner 22 is also formed at electrode 14.

The minimum distance between spiral metal layer 16 disposed at the outermost periphery of coil section 18 and the side surface of element 12, that is, end margin W is set to 5 µm to 50 µm. Also, the maximum diameter of coil section 18 is 5 µm to 150 µm, and the height of element 12 formed by a plurality of insulating resin layers 20 laminated is 50 µm to 1 mm.

The manufacturing process of chip part 26 will be described in the following. FIG. 2 is a schematic plan view showing a state of a plurality of chip parts connected in one preferred embodiment of the present invention.

Chip part 26 is formed in such a state that a plurality of chip parts 26 are connected to each other. A part of the plurality of chip parts 26 is shown by portion P.

FIG. 3 is an enlarged view of portion P shown in FIG. 2 in the preferred embodiment 1 of the present invention. A plurality of chip parts 26, three times three, totalling nine pieces are disposed. Chip part 26 has coil section 18, and the coil section 18 is formed by spiral metal layer 16. Chip parts 26 adjacent to each other are connected by frame-like connection 28, but finally the plurality of chip parts 26 are separated at frame-like connection 28 to become separate from each other. The method of forming frame-like connection 28 and the separation of chip parts 26 from each other will be described later.

FIG. 4A to FIG. 4F show the manufacturing process of chip part 26 in the preferred embodiment 1 of the present invention.

Figure 4:
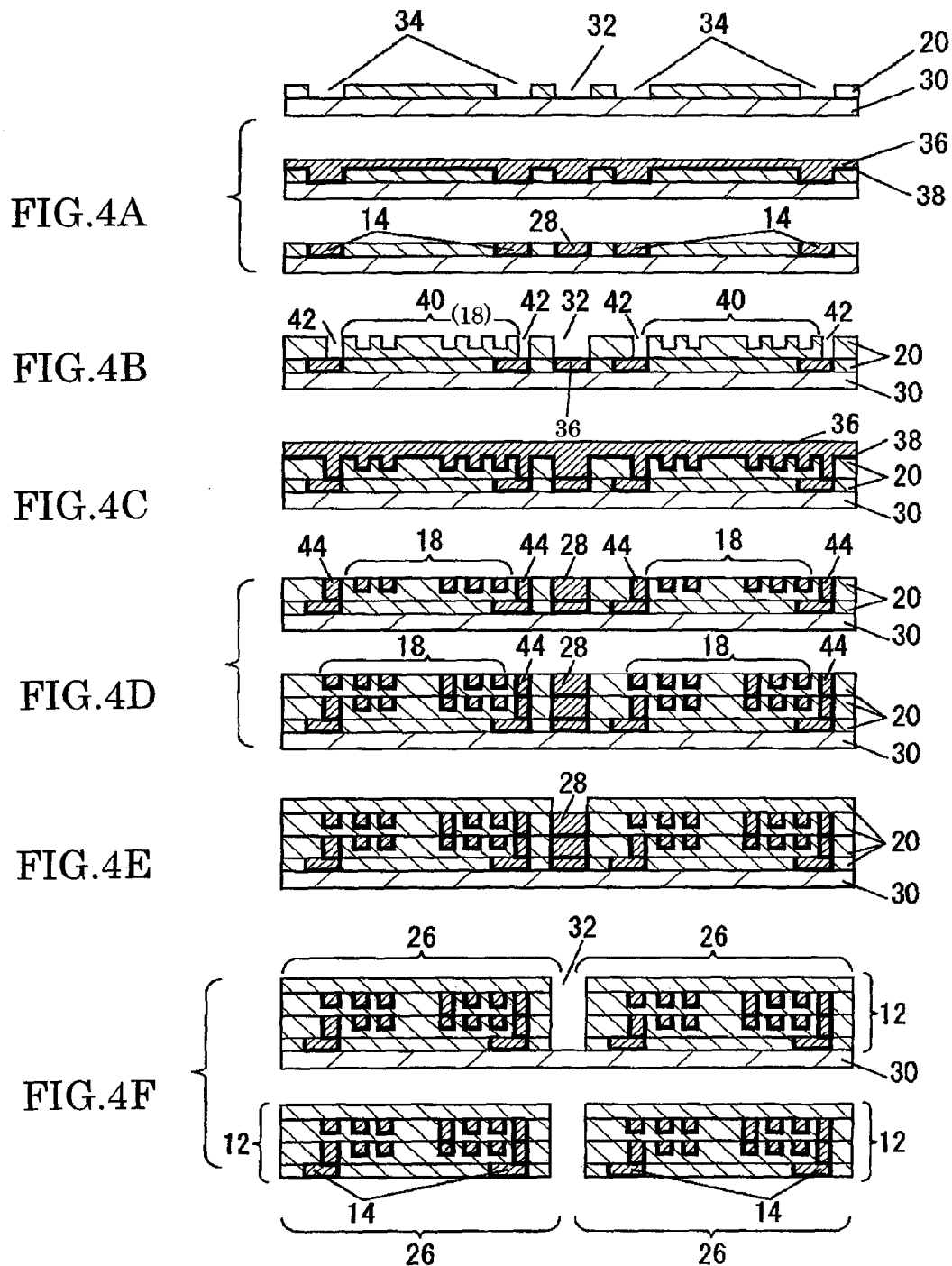
FIG. 4A to FIG. 4F are process diagrams showing the chip part manufacturing process in one preferred embodiment of the present invention.

FIG. 4A shows a step of forming an electrode. A release layer not shown is formed on one main surface of substrate 30. The release layer is formed by using release resist for example. On the release layer is formed insulating resin layer 20 having a predetermined void portion by means of photolithography process. In the present invention, it is not always necessary to form a release layer. However, when a release layer is formed, it is easier to remove the part from the substrate as compared with the case of forming no release layer, and it is possible to re-use the substrate.

The void portions formed in a part of insulating resin layer 20 include a plurality of frame-like void portions 32 adjacent each other and electrode void portions 34 disposed in the region of frame-like void portion 32. Chip part 26 is formed in the region of frame-like void portion 32, and frame-like connection 28 for connecting a plurality of chip parts 26 (see FIG. 1) is formed in frame-like void portion 32. Also, in the electrode forming process shown in FIG. 4A, metal layer 36 is formed in frame-like void portion 32 and electrode void portion 34 and on insulating resin layer 20. Metal layer 36 has surface conductor layer 38 formed by a non-electrolytic plating process or sputtering process or evaporation process, which is formed by an electrolytic plating process on surface conductor layer 38.

Metal layer 36 is polished at least up to the same height as the upper surface of insulating resin layer 20, and electrode 14 formed from metal layer is formed in electrode void portion 34. Also, frame-like connection 28 formed from metal layer is formed by metal layer 36 in frame-like void portion 32. That is, metal layer 36 is provided for forming both of electrode 14 and frame-like connection 28. Metal layer 36 formed on frame-like connection 28 is formed at a portion where electrode 14 is separated from adjacent electrode 14.

FIG. 4B shows a step of forming an insulating resin layer. After completion of the process shown in FIG. 4A, insulating resin layer 20 having a predetermined void portions is newly formed by a photolithography process on previously formed insulating resin layer 20, electrode 14 and frame-like connection 28. After that, the pattern shown in FIG. 4B is formed by patterning and etching as specified. Insulating resin layer 20 is newly formed on one main surface of substrate 30. At the same time, a plurality of frame-like void portions 32 adjacent each other, spiral void portion 40 disposed in the region of frame-like void portion 32, and through-hole void portion 42 are formed. Frame-like void portion 32 is formed in such manner as to almost overlap the frame-like void portion 32 shown in FIG. 4A.

FIG. 4C shows a step of forming a metal layer. Metal layer 36 is formed in frame-like void portion 32, spiral void portion 40, through-hole void portion 42, and on insulating resin layer 20 which are shown in FIG. 4B. Metal layer 36 has surface conductor layer 38 formed by a non-electrolytic plating process, sputtering process or evaporation process, which is formed by an electrolytic plating process on surface conductor layer 38.

FIG. 4D shows a step of forming a coil section. Coil section 18 having two layers of spiral metal layer 16 is formed. In the coil section forming process, metal layer 36 is polished at least up to the same height as the upper surface of insulating resin layer 20, and coil section 18 having spiral metal layers 16 is formed in spiral void portion 40. Also, frame-like connection 28 formed from metal layer is formed in frame-like void portion 32, and through-hole 44 formed by metal layer is formed in through-hole void portion 42. Metal layer 36 formed on frame-like connection 28 is formed at a portion where electrode 14 is separated from adjacent electrode 14.

Further, the insulating resin layer forming process shown in FIG. 4B and the metal layer forming process shown in FIG. 4C are repeatedly performed to form two-layer coil section 18. Through-hole 44 establishes communication between two-layer coil sections 18 and between electrode 14 and coil section 18.

FIG. 4E shows a step of forming a protective layer. Insulating resin layer 20 having a predetermined void portion is newly laminated by a photolithography process on frame-like connection 28, coil section 18, through-hole 44, and insulating resin layer 20 shown in FIG. 4D in order to form a protective layer. The void portion includes a plurality of frame-like void portions 32 adjacent each other. Also, frame-like void portion 32 is formed in such manner as to overlap the frame-like void portion 32 formed in the insulating resin layer forming process shown in FIG. 4B.

FIG. 4F shows a step of separating chip electronic parts. The metal layer formed in frame-like void portion 32 is melted and removed by using an etching agent. A plurality of chip parts 26 connected to each other by frame-like connection 28 are separated. Chip parts 26 are removed from the release layer (not shown) disposed on one main surface of substrate 30 by using a solvent, alkali or the like to be separated into individual pieces.

In this way, element 12 is formed by insulating resin layers 20 laminated in the electrode forming process (FIG. 4A), insulating resin layer forming process (FIG. 4B), and protective layer forming process (FIG. 4E), and electrode 14 is disposed on the underside or the side of element 12, and coil section 18 is buried in element 12.

In the chip part manufacturing method shown in FIG. 4A to FIG. 4F, metal layer 36 is made of Cu, Al, Ag, Au, Ni or alloy of these metals or alloy containing these metals, and it is desirable to be an excellent conductive metal layer. Also, as surface conductive layer 38, it is preferable to use a metal layer made of Cu, Al, Ag, Au, Ni, Cr, or Ti, which assures excellent adhesion to insulating resin layer 20. Also, the layer is formed by a non-electrolytic plating process, sputtering process, or evaporation process.

Also, for insulating resin layer 20, it is preferable to use a clear photosensitive resin material obtained by hardening photosensitive resin. Using clear photosensitive resin brings about such a convenience that the appearance inspection of each conductor layer can be easily performed. Insulating resin layer 20 is formed into a predetermined shape by a photolithography process with use of resin such as epoxy type, phenol type, polyimide type or the like. Such resin configures element 12 of final chip part 26 unlike the resist used in a general photolithography process, and generally, it gives rise to generation of static electricity. Therefore, it is preferable to select resin that may suppress the generation of static electricity or to include an additional configuration for diffusing static electricity.

As a method of polishing insulating resin layer 20 and metal layer 36, it is preferable to employ CMP (chemical mechanical polishing) method using CMP slurry. Since only metal layer can be selectively polished while etching metal layer 36 by CMP polishing method, it is possible to improve the polishing accuracy. As another polishing method, it is preferable to employ a mechanical polishing method using diamond slurry or alumina slurry. However, taking into account the polishing accuracy, it is preferable to employ CMP polishing method. As metal layer 36, in case of using the one not suited for CMP, it is allowable to use a mechanical polishing method only for polishing the portion.

In the above configuration, a plurality of chip parts 26 are connected to each other by frame-like connection 28 formed from metal layer. To take out these chip parts as separate individual pieces, the metal layer is melted and removed by etching, and thereby, the plurality of chip parts 26 connected to each other by frame-like connection 28 are separated. The generation of cutting stresses in chip parts 26 can be suppressed in this separating method. Accordingly, it is possible to suppress the deformation of chip parts 26 and to improve the manufacturing yield and quality of chip parts 26.

Also, in the chip part manufacturing method of the present invention, a photolithography process is employed to form frame-like connection 28 and spiral metal layer 16. Thus, it is possible to perform the step of separating the chip parts into individual pieces while suppressing the generation of stresses. Also, the end margin W from the end of chip part 26 can be minimized. As a result, it is possible to execute the design with high conductor position accuracy making the most of the size of chip part 26.

The chip part manufacturing method of the present invention brings about more remarkable effects when chip part 26 is smaller in size. For example, the influence of end margin W from the end is greater when the size is for example as small as 1005 size (1.0 mm×0.5 mm), 0603 size (0.6 mm×0.3 mm). According to the present invention, it is possible to more enhance the characteristics as compared with a conventional process with respect to the electrical characteristics of chip parts, for example, the level of inductance and the value of Q in the case of chip inductor.

Particularly, metal layer 36 is formed in frame-like void portion 32 and on insulating resin layer 20, and the metal layer 36 is polished at least up to the upper surface of insulating resin layer 20, and thereby, it is possible to easily form frame-like connection 28 formed from metal layer which connects chip parts 26 in frame-like void 32.

Frame-like void 32 is generally squared and its inner periphery corner is arcuate, and therefore, chip part 26 can be formed generally arcuate at first corner 22 which connects a surface vertical to the mounting surface to an adjacent vertical surface. As a result, when a plurality of chip parts 26 are fed into the apparatus by means of a parts feeder or the like, the parts can be smoothly fed even in case chip parts 26 come into contact with each other because the first corner 22 of chip part 26 is generally arcuate. It is possible to suppress the break or crack in chip parts 26. On the other hand, second corner 24 formed by surfaces vertical and parallel to the mounting surface which adjoin each other is generally squared, and therefore, it is possible to suppress rising of the chips at the time of mounting.

The inner periphery corner of frame-like void portion 32 can be easily chamfered or formed into other shapes according to the above method.

In the manufacturing process, a plurality of chip parts 26 are previously connected to each other by frame-like connection 28 formed from metal layer formed in frame-like void portion 32 whose inner periphery corner is arcuate, and the metal layer is melted and removed by using an etching agent to separate the plurality of chip parts 26 connected to each other by frame-like connection 28. Accordingly, it is possible to form the first corner 22 generally arcuate and the second corner 24 generally squared.

Also, since insulating resin layer 20 is formed by a photolithography process, it is possible to accurately control the conductor position and chip size. Also, clear photosensitive resin is used for insulating resin layer 20, and therefore, element 12 is transparent, making it easier to execute the conductor appearance inspection of each layer. Also, it is possible to make the aspect ratio larger and to easily increase the thickness of coil section 18.

Further, metal layer 36 has surface conductor layer 38 formed by a non-electrolytic plating process or sputtering process or evaporation process, and it is possible to easily form coil section 18 increased in density, forming it on surface conductor layer 38 by an electrolytic plating process.

(Preferred Embodiment 2)

FIG. 5A to FIG. 5G show another manufacturing process of chip part 26 of the present invention. Since FIG. 1, FIG. 2 and FIG. 3 used in the preferred embodiment 1 can be used in the preferred embodiment 2 as well, the detailed description is omitted. As compared with the preferred embodiment 1, one more manufacturing process is shown in the preferred embodiment 2. Also, it is clear at first sight that FIG. 5A to FIG. 5G are similar to FIG. 4A to FIG. 4F.

Figure 5:
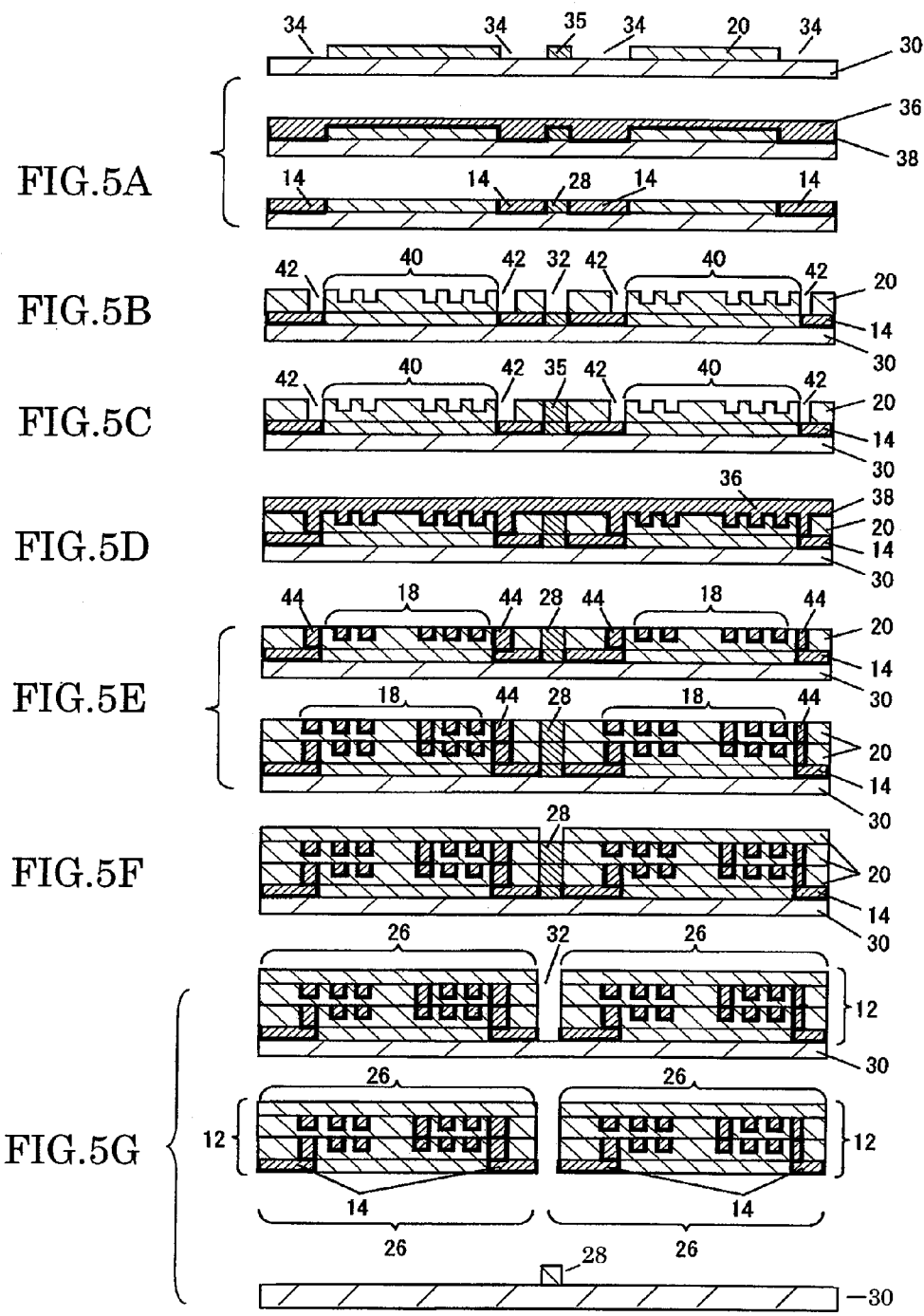
FIG. 5A to FIG. 5G are process diagrams showing the chip part manufacturing process in another preferred embodiment of the present invention.
Figure 6:
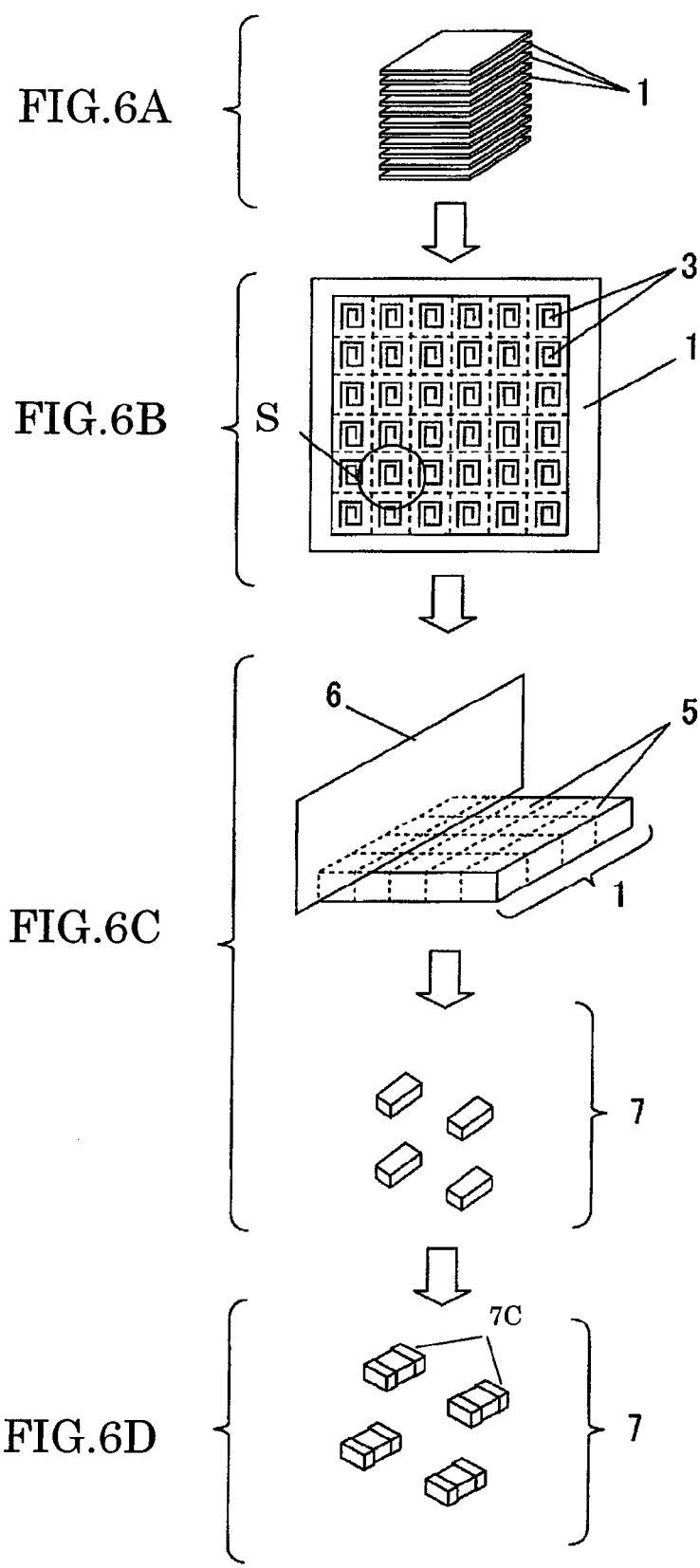
FIG. 6A to FIG. 6D are process diagrams showing a conventional chip part manufacturing process.
Figure 7:
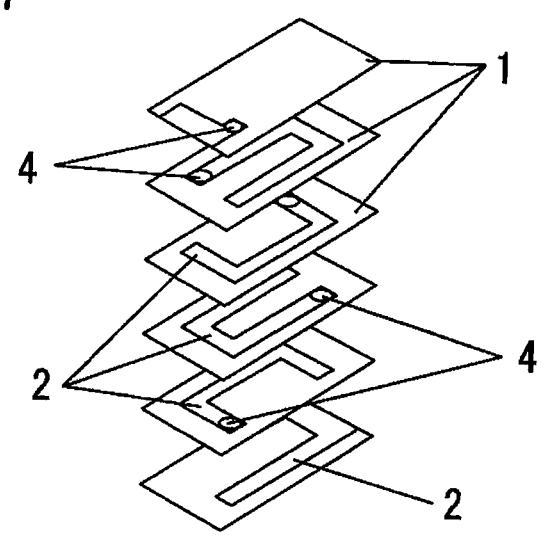
FIG. 7 is an exploded perspective view of portion S shown in FIG. 6B.

FIG. 5A shows a step of forming an electrode. At the top of FIG. 5A, a release layer (not shown) is formed on one main surface of substrate 30, and insulating resin layer 20 having electrode void portion 34 is formed by a photolithography process on the upper surface of the release layer. The release layer can be, for example, formed by using release resist. In the case of forming a release layer, the chip parts described later can be easily separated from the frame-like connection and it is possible to suppress the generation of cutting stresses.

The void portions formed in a part of insulating resin layer 20 include a plurality of frame-like void portions 32 adjacent each other and electrode void portion 34 disposed in the region of frame-like void portion 32. Chip part 26 shown in FIG. 1 is formed in the region of frame-like void portion 32, and frame-like connection 28 for connecting a plurality of chip parts 26 is formed in frame-like void portion 32. Also, in the electrode forming process shown in FIG. 5A, metal layer 36 is formed in frame-like void portion 32 and electrode void portion 34 and on insulating resin layer 20. Metal layer 36 has surface conductor layer 38 formed by a non-electrolytic plating process or sputtering process or evaporation process, which is formed on surface conductor layer 38 by an electrolytic plating process.

Metal layer 36 is polished at least up to the same height as the upper surface of insulating resin layer 20, and electrode 14 formed from metal layer is formed in electrode void portion 34. Also, frame-like connection 28 formed from metal layer is formed by metal layer 36 in frame-like void portion 32. That is, metal layer 36 is provided for forming both of electrode 14 and frame-like connection 28. Metal layer 36 formed on frame-like connection 28 is formed at a portion where electrode 14 is separated from adjacent electrode 14.

FIG. 5B shows a step of forming an insulating resin layer. After completion of the process shown in FIG. 5A, insulating resin layer 20 having predetermined void portions is newly formed by a photolithography process on previously formed insulating resin layer 20, electrode 14 and frame-like connection 28. After that, the pattern shown in FIG. 5B is formed by patterning and etching as specified. Insulating resin layer 20 is newly formed on one main surface of substrate 30. At the same time, a plurality of frame-like void portions 32 adjacent each other, spiral void portion 40 disposed in the region of frame-like void portion 32, and through-hole void portion 42 are formed. Frame-like void portion 32 is formed in such manner as to almost overlap the frame-like void portion 32 shown in FIG. 5A.

FIG. 5C is a step of forming a resist. The resist forming process is a manufacturing process not employed in the preferred embodiment 1 (FIG. 4A to FIG. 4F). Resist 35 is formed in frame-like void portion 32, and frame-like connection 28 formed from resist 35 is formed in frame-like void portion 32.

Here, resist 35 is used for frame-like connection 28 in the description. However, it is possible to use insulating resin layer 20 in place of resist 35 as described earlier. In that case, the resist forming process shown in FIG. 5C is not needed.

FIG. 5D shows a step of forming a metal layer. Metal layer 36 is formed over spiral void portion 40, resist 35, through-hole void portion 42, and insulating resin layer 20 which are shown in FIG. 5C. Metal layer 36 has surface conductor layer 38 formed by a non-electrolytic plating process, sputtering process or evaporation process, which is formed on surface conductor layer 38 by an electrolytic plating process.

FIG. 5E shows a step of forming a coil section. Coil section 18 having two layers of spiral metal layer 16 is formed (see FIG. 3). In the coil section forming process, metal layer 36 is polished at least up to the same height as the upper surface of insulating resin layer 20, and coil section 18 having spiral metal layers 16 is formed in spiral void portion 40 (see FIG. 4C). Frame-like connection 28 formed from metal layer is formed in frame-like void portion 32, and through-hole 44 with metal layer buried therein is formed in through-hole void portion 42.

Further, the insulating resin layer forming process (FIG. 5B), the resist forming process (FIG. 5C), and the metal layer forming process shown (FIG. 5D) are repeatedly performed to form two-layer coil section 18. Through-hole 44 establishes communication between two-layer coil sections 18 and between electrode 14 and coil section 18.

FIG. 5F shows a step of forming insulating resin layer 20 and also forming a protective layer by forming insulating resin layer 20 having predetermined void portions by means of a photolithography process. The void portions include a plurality of frame-like void portions 32 adjacent each other, and frame-like void portion 32 is formed in such manner as to overlap frame-like void 32 formed by a resist forming process (FIG. 5C).

FIG. 5G shows a separating process, and resist 35 formed in frame-like void portion 32 is melted and removed by a resist release agent. A plurality of chip parts 26 connected to each other by frame-like connection 28 are separated, and chip parts 26 are removed from the release layer of substrate 30 by using a solvent, alkali or the like to be separated into individual pieces When frame-like connection formed between electrode void portions 34 adjacent each other and adjacent electrode void portion 34 is formed by insulating resin layer 20, the adhesion between frame-like connection 28 and the release layer formed on substrate 30 is greater than the bonding strength between frame-like connection 28 and electrode 14. Accordingly, when chip parts 26 are separated, it becomes possible to first separate the connection before separating the part from rigid substrate 30, and thereby, a plurality of chip parts 26 connected to each other can be separated under the condition of low stresses.

Frame-like connection 28 is not always required to be tightly held on the release layer for achieving the separating purpose, but the purpose can be precisely achieved with it tightly held on the connection.

In this way, element 12 is formed by insulating resin layers 20 laminated through the electrode forming process (FIG. 5A), insulating resin layer forming process (FIG. 5B), and protective layer forming process (FIG. 5F). Electrode 14 is disposed on the underside and the side of electrode 12, and coil section 18 is buried in element 12.

In the chip part manufacturing method shown in the preferred embodiment 2, metal layer 36 is preferable to be a metal layer having excellent conductivity which is made of Cu, Al, Ag, Au, Ni or alloy of these metals. Also, as surface conductor layer 38, it is preferable to use a metal layer having excellent adhesion to insulating resin layer 20 made of Cu, Al, Ag, Au, Ni, Cr, Ti or the like, and it is preferable to form the layer by means of a non-electrolytic plating process, sputtering process, or evaporation process.

Also, insulating resin layer 20 is preferable to be a clear photosensitive resin material obtained by hardening photosensitive resin. Insulating resin layer 20 is formed into a predetermined shape by a photolithography process, using resin such as epoxy type, phenol type, polyimide type or the like. Insulating resin layer 20 configures element 12 of final chip part 26 unlike the resist 36 used in a general photolithography process, and generally, it gives rise to generation of static electricity. Therefore, it is also preferable to select resin that may suppress the generation of static electricity or to include an additional configuration for diffusing static electricity.

Also, as a polishing method, it is preferable to employ CMP method using CMP slurry. Since only metal layer can be selectively polished while etching metal layer 36 in CMP polishing method, it is possible to improve the polishing accuracy. As another polishing method, it is preferable to employ a mechanical polishing method using diamond slurry or alumina slurry. However, it is a little lower in polishing accuracy than CMP polishing method. Also, as metal layer 36, in case of using the one not suited for CMP polishing, it is allowable to use a mechanical polishing method only for polishing the portion.

In the above configuration, a plurality of chip parts 26 are previously connected to each other by frame-like connection 28 formed from metal layer. The metal layer is melted and removed by using an etching agent to separate the plurality of chip parts 26 connected to each other by frame-like connection 28. Accordingly, it is possible to suppress the generation of such trouble that cutting stress is applied to chip parts 26. That is, chip parts 26 can be manufactured while suppressing deformation of chip parts 26. Resist 35 is formed in frame-like void portion 32, and frame-like connection 28 formed from resist 35 which connects chip parts 26 is formed in frame-like void portion 32, and therefore, it is possible to easily form frame-like connection 28.

Also, a photolithography process is employed to form frame-like connection 28 and spiral metal layer 16, and the process of separating chip parts into individual pieces can be performed while suppressing the generation of stresses, and therefore, it is possible to minimize the end margin W from the end of chip part 26. As a result, it is possible to execute the design with high conductor position accuracy making the most of the size of chip part 26. Accordingly, the influence of end margin W from the end is greater when the size is for example as small as 1005 size (1.0 mm×0.5 mm), 0603 size (0.6 mm×0.3 mm). As a result, is possible to more enhance the characteristics as compared with a conventional process with respect to the electrical characteristics of chip parts, for example, the level of inductance and the value of Q in the case of chip inductor.

Also, frame-like void portion 32 is generally squared and its inner periphery corner is arcuate, and therefore, the first corner 22 of chip part 26 formed at the boundary between surfaces perpendicular to the mounting surface can be formed generally arcuate. As a result, when a plurality of chip parts 26 are fed into the apparatus by means of a parts feeder or the like, the parts can be smoothly fed even in case chip parts 26 come into contact with each other because the first corner 22 of chip part 26 is generally arcuate, and it is possible to suppress the break or crack in chip parts 26. On the other hand, second corner 24 formed by surfaces vertical and parallel to the mounting surface which adjoin each other is generally squared, and therefore, it is possible to suppress rising of the chips at the time of mounting. It is also easy to make the inner periphery corner of frame-like void portion 32 chamfered or formed into other shapes by using the above method.

Also, insulating resin layer 20 is formed by a photolithography process and, therefore, it may assure excellent conductor position accuracy and chip size accuracy. Also, since clear photosensitive resin is used for insulating resin layer 20, element 12 is transparent, and it is easy to perform the appearance inspection of each layer. Also, it is possible to make the aspect ratio greater and coil section 18 thicker.

Further, metal layer 36 includes surface conductor layer 38 formed by a non-electrolytic plating process, sputtering process, or evaporation process, which is formed on surface conductor layer 38 by means of an electrolytic plating process, and thereby, it is possible to easily form coil section 18 increased in density.

INDUSTRIAL APPLICABILITY

As described above, the chip part manufacturing method of the present invention is capable of manufacturing chip parts while suppressing deformation, which is therefore applicable to various electronic appliances and very high in industrial applicability.

The invention claimed is:

1. A chip part manufacturing method, comprising a process of separating a plurality of chip parts connected to each other by a connection on one main surface of a substrate into individual pieces, wherein the connection is formed from metal layer, and the metal layer is melted and removed by using an etching agent to separate the plurality of chip parts connected to each other by the connection comprising the steps of:

forming an insulating resin layer having a plurality of frame-like void portions adjacent each other and a spiral void portion disposed in a region of the frame-like void portion;

forming a metal layer in the frame-like void portion and the spiral void portion and on the insulating resin layer;

polishing the metal layer at least up to the upper surface of the insulating resin layer; and forming a coil section formed from spiral metal layer in the spiral void portion.

2. A chip part manufacturing method, comprising a process of separating a plurality of chip parts connected to each other by a connection on one main surface of a substrate into individual pieces, wherein the connection is formed from metal layer, and the metal layer is melted and removed by using an etching agent to separate the plurality of chip parts connected to each other by the connection comprising the steps of:

a first step of forming an insulating resin layer having a plurality of frame-like void portions and an electrode void portion disposed in a region of the frame-like void portion;

a second step of forming a metal layer in the frame-like void portion and the spiral void portion and on the insulating resin layer; and a third step of polishing the metal layer at least up to the upper surface of the insulating resin layer, wherein the first, the second and third steps are repeatedly performed to form the connection which the metal layer buried in the frame-like void portion.

* * * * *